(12) United States Patent
Dierickx et al.

(10) Patent No.: US 6,690,074 B1
(45) Date of Patent: Feb. 10, 2004

(54) RADIATION RESISTANT SEMICONDUCTOR DEVICE STRUCTURE

(75) Inventors: Bart Dierickx, Mortsel (BE); Jan Bogaerts, Sint-Katelijne-Waver (BE)

(73) Assignee: FillFactory, Mechelen (BE)

( * ) Notice: Subject to any disclaimer, the term of this patent is extended or adjusted under 35 U.S.C. 154(b) by 0 days.

(21) Appl. No.: 10/233,894

(22) Filed: Sep. 3, 2002

Related U.S. Application Data

(63) Continuation-in-part of application No. 09/732,610, filed on Dec. 8, 2000, now abandoned.
(60) Provisional application No. 60/170,442, filed on Dec. 10, 1999.

(51) Int. Cl.$^7$ ............................................. H01L 29/772
(52) U.S. Cl. ........................ 257/398; 257/399; 257/400
(58) Field of Search ................................... 257/398, 399, 257/400

(56) References Cited

U.S. PATENT DOCUMENTS 5,192,993 A * 3/1993 Arai et al. .................. 257/400
5,841,176 A * 11/1998 Merrill ....................... 257/446

* cited by examiner

Primary Examiner—Jerome Jackson
(74) Attorney, Agent, or Firm—Barnes & Thornburg

(57) ABSTRACT

A semiconductor device structure is described for reducing radiation induced current flow caused by incident ionizing radiation. The structure comprises a semiconductor substrate; two or more regions of a first conductivity type in the substrate; and a guard ring of a second conductivity type for obstructing radiation induced parasitic current flow between the two or more regions of the first conductivity type. The structure may be used in a pixel, e.g. in a diode or a transistor, for increasing radiation resistance.

18 Claims, 8 Drawing Sheets

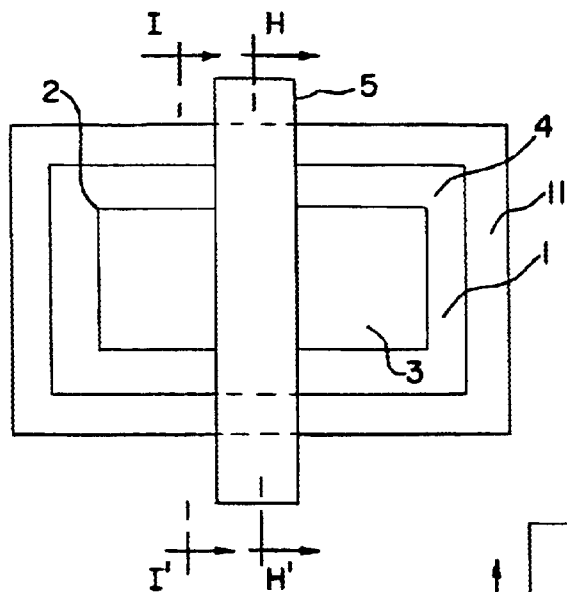
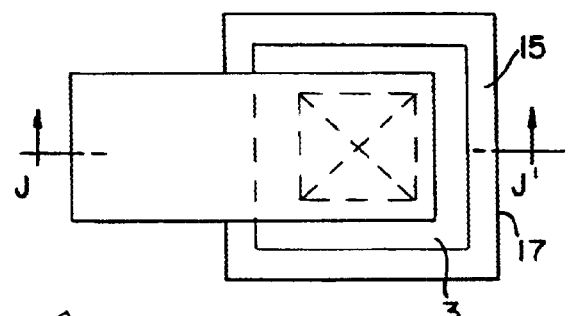
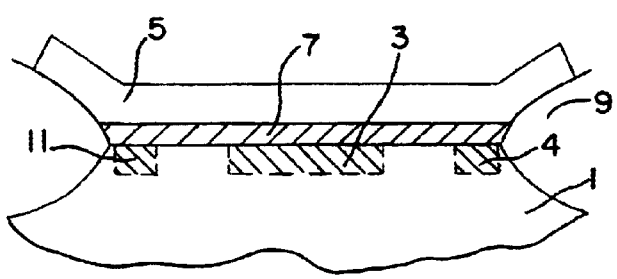
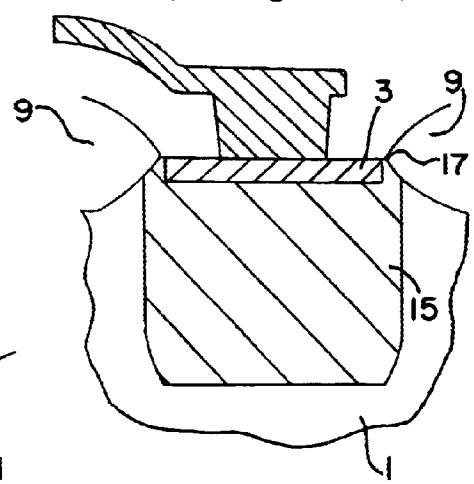
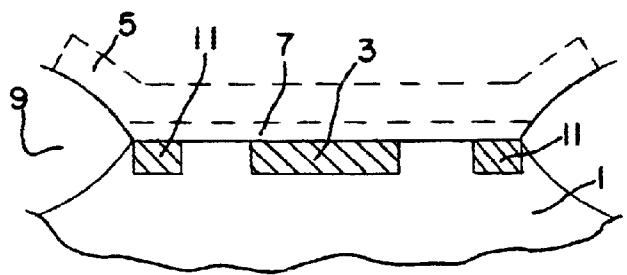

RADIATION RESISTANT SEMICONDUCTOR DEVICE STRUCTURE

RELATED APPLICATION

This application is a continuation-in-part of copending U.S. patent application Ser. No. 09/732,610, filed Dec. 8, 2000, now abandoned, which is the non-provisional filing of U.S. Provisional Application Serial No. 60/170,442, filed Dec. 10, 1999.

FIELD OF THE INVENTION

The present invention relates to the field of semiconductor device structures, especially transistor, diode and pixel structures, more particularly to a pixel structure, that does not show a degradation when irradiated with ionizing radiation. The present invention also relates to a method for manufacturing such a semiconductor device structure.

STATE OF THE ART

Ionizing radiation is known to cause damage to transistors comprised on a semiconductor surface e.g. as in a pixel arrangement of a display device or camera, which typically comprises a photodiode and a few transistors for resetting the photodiode and to read out the signal. The pixel structures of the state of the art usually comprise several transistors that comprise a source and a drain region, separated by a gate-oxide under a polysilicon gate electrode and surrounded by field oxide. The polysilicon gate electrode usually overlaps part of the field oxide, creating a parasitic MOSFET. Under normal circumstances, this does not present a problem since the threshold voltage of this MOSFET lies much higher than the threshold voltage of the actual transistor.

Ionizing radiation will typically lead to a shift of the threshold voltage, and this effect will be, depending on the voltage of the field oxide, more pronounced in the MOSFET than in the actual transistor, possibly creating a leak path. This will result in a transistor that cannot be switched off any more. The extent of these effects also depends on the thickness and quality of the oxides and on the magnitude of the electric field.

Many semiconductor devices suffer from radiation sensitivity. This is particularly true for electronic devices used in space, where they may be subject to ionizing radiation such as cosmic rays. Ionizing radiation may include high energy electromagnetic radiation like γ rays or high energy particles. Pixels and other semiconductor devices must be sensitive to electromagnetic radiation of one type (e.g. visible light, UV light, infra-red light) or must be visible if they are part of a display device which is to be viewed. Thus, protective shielding, such as a metal layer, cannot be placed around such devices. This means that resistance to ionizing radiation must be provided by some other means. Further, where large arrays of pixels are fabricated using VLSI techniques it is difficult to provide protective layers at the pixel level, e.g. by depositing thick metal layers locally to a pixel during semiconductor processing.

AIMS OF THE INVENTION

An aim of the present invention is to provide a radiation resistant semiconductor device structure.

A further aim of the present invention is to provide a method for manufacturing such a radiation resistant semiconductor device structure.

SUMMARY OF THE INVENTION

A first aspect of the present invention concerns a semiconductor transistor device structure for reducing radiation induced current flow caused by incident ionizing radiation, comprising:

a semiconductor substrate;

two or more regions of a first conductivity type in the substrate; and a doped guard ring of a second conductivity type surrounding the two or more regions of a first conductivity type for obstructing radiation induced parasitic current flow between the two or more regions of the first conductivity type. The guard ring is a ring interrupted by an active area of the substrate controlled by a gate electrode.

The present invention may also provide a pixel sensitive to a radiation of a first type with reduced radiation induced current flow caused by incident ionizing radiation of a second type, comprising:

a semiconductor substrate;

two or more regions of a first conductivity type in the substrate; and a doped guard ring of a second conductivity type surrounding the two or more regions of a first conductivity type for obstructing radiation induced parasitic current flow between the two or more regions of the first conductivity type. The guard ring is a ring interrupted by an active area of the substrate controlled by a gate electrode.

The present invention may also provide a semiconductor transistor structure including a semiconductor substrate, two or more regions of a first conductivity type in the substrate, and a doped guard ring of a second conductivity type surrounding the two or more regions of a first conductivity type for obstructing radiation induced parasitic current flow between the two or more regions of the first conductivity type, the guard ring being a ring interrupted by an active area of the substrate controlled by a gate electrode. The region of a first conductivity type comprises a source part and a drain part separated by a junction, and the gate electrode covers at least part of said junction, wherein said second region surrounds said first region but is not in direct contact with said first region.

The present invention may also provide a photodiode device comprising:

a semiconductor substrate, a first region of a first conductivity type in the substrate, a gate electrode surrounding said first region, and a doped guard ring of a second conductivity type surrounding said gate electrode, wherein the guard ring is a ring interrupted by an active area of the substrate controlled by the gate electrode.

The present invention will now be described with reference to the following drawings.

BRIEF DESCRIPTION OF THE DRAWINGS

FIG. 1a is a top view of the nMOS transistor structure, FIG. 1b is a cross-sectional side view along line A–A' in FIG. 1a, and FIG. 1c is a cross-sectional side view along line B–B' in FIG. 1a.

FIG. 2a is a top view of a first embodiment of an nMOS structure according to the present invention. FIG. 2b is a cross-sectional side view along line C–C' in FIG. 2a, FIG. 2c is a cross-sectional side view along line D–D' in FIG. 2a, and FIG. 2d is a cross-sectional side view along line K–K' in FIG. 2a. FIG. 3a is a top view of a second embodiment of an nMOS structure according to the present invention. FIG. 3b is a cross-sectional side view along line E–E' in FIG. 3a, FIG. 3c is a cross-sectional side view along line F–F' in FIG. 3a, and FIG. 3d is a cross-sectional side view along line G–G' in FIG. 3a.

FIGS. 4a–c depict an embodiment of an nMOS structure according to the present invention comprising a p+ guard ring and no field oxide between n-diffusion and p-diffusion regions. FIG. 4a is a top view of an nMOS structure according to this embodiment. FIG. 4b is a cross-sectional side view along line H–H' in FIG. 4a and FIG. 4c is a cross-sectional side view along line I–I' in FIG. 4a.

FIGS. 5a and b show a state of the art n-well/p-substrate photodiode. FIG. 5a is a top view, and FIG. 5b is a cross-sectional side view along line J–J' in FIG. 5a.

FIGS. 6a and 7a are top views of the respective embodiments.

DETAILED DESCRIPTION OF THE INVENTION

The present invention will be described using several examples. These examples are not to be considered limiting to the scope of the present invention. Further, in the examples only the embodiment where the conductivity of a first region is determined by a first doping type, e.g. p, and the conductivity of a second region by a second doping type, such as n, are mentioned. It is clear for the person skilled in the art that the types can be switched to obtain an alternative embodiment of the present invention.

Figure 1A:
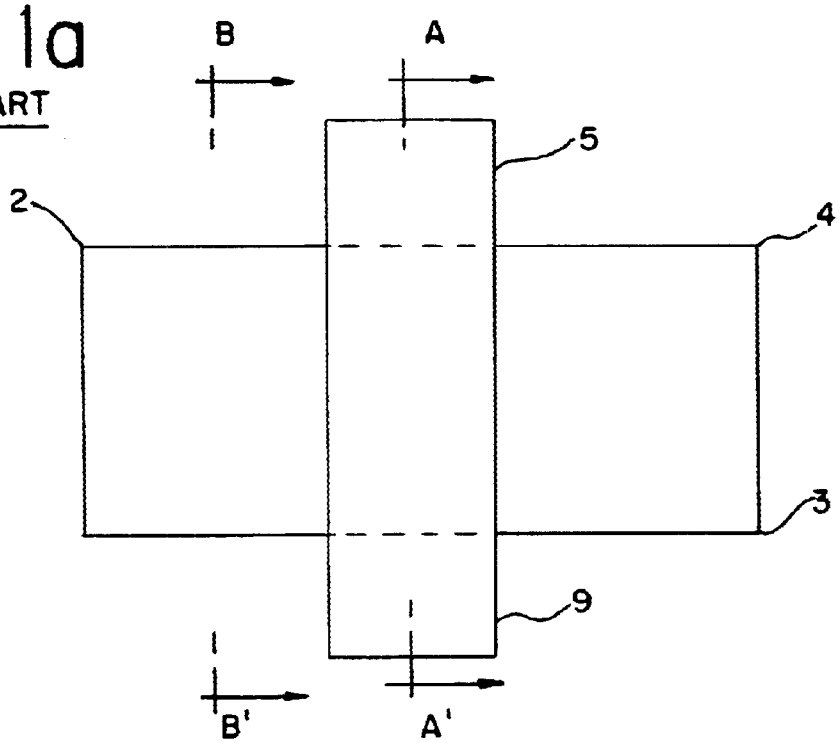
FIGS. 1a–c show a state of the art nMOS transistor structure.
Figure 1B:
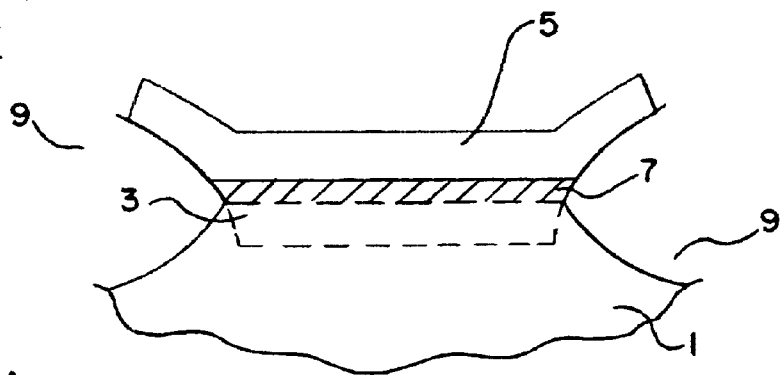
Figure 1C:
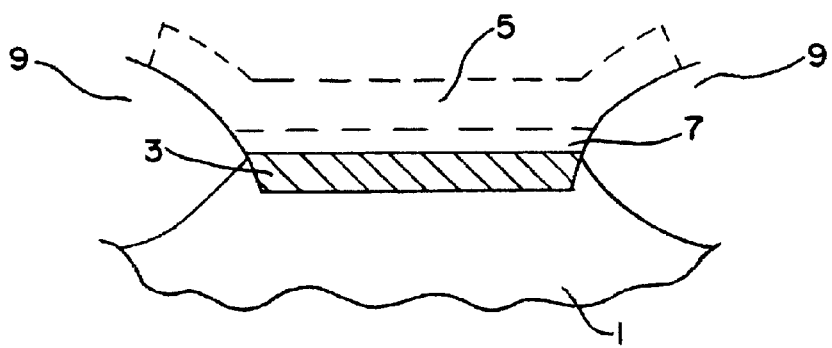

FIGS. 1a–c show a prior art nMOS transistor which is embedded on a p-substrate 1. General methods of manufacture of MOS and CMOS transistors may be found in "Introduction to micorelectronic fabrication", by Richard C. Jaeger, Addison-Wesley series on solid state devices, 1988 and "VLSI Technology", S. M. Sze, McGraw-Hill Book Company, 1988. An n+ doped region 3 having a source side 2 and a drain side 4 and extending up to gate electrode 5 is shown. Directly underneath the gate electrode 5, a gate oxide layer 7 has been deposited onto the substrate above a gate region, as can be seen in FIG. 1b, which shows a side view along line A–A'. Where layer 3 is shown in dark gray with a solid black line around it (as in FIG. 1c), it is part of the section. Where it is shown in light gray with a dashed line around it (as in FIG. 1b), it is remote from the section but can be seen in a side view through the transparent semiconductor material. FIG. 1c, a side view along line B–B', shows that the n+ doped region 3 is sectioned in this view (dark gray with a solid black line around it) and is covered with gate oxide layer 7. Contact is made to the drain and source regions by vias through this gate oxide layer 7. The gate electrode 5 is shown as a dashed line indicating that the electrode is not part of the section but is remote therefrom. The gate electrode 5 and gate oxide layer 7 are in contact with field oxide 9, which gives rise to a parasitic MOSFET. A current leak between source and drain via the field oxide can be formed and will block the normal MOS operation.

Figure 2A:
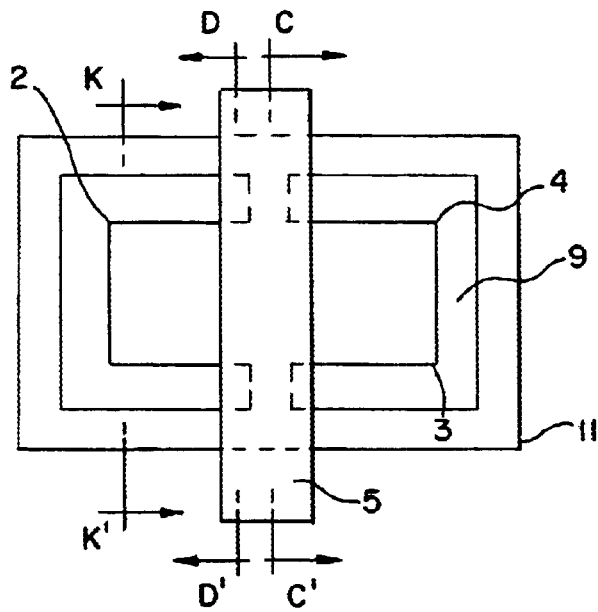
FIGS. 2a–d and 3a–d show two different embodiments of an nMOS structure according to the present invention comprising a p+ guard ring and in which the field oxide is interrupted under the gate.
Figure 2B:
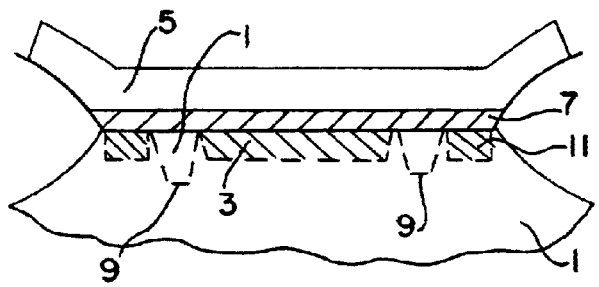
Figure 2C:
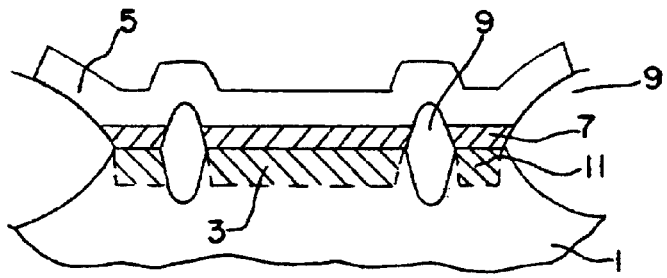
Figure 2D:
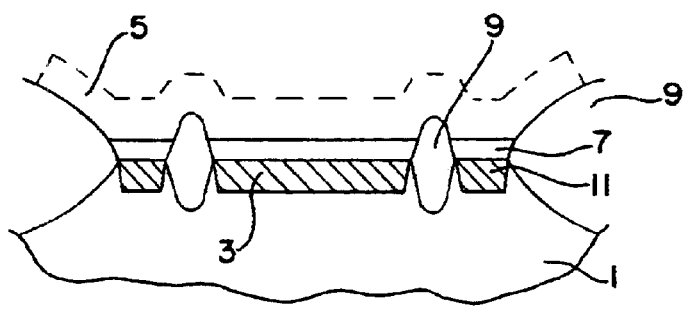

A first embodiment of the present invention is depicted in FIGS. 2a to d. The novel structure comprises an n+ doped region 3, a gate oxide layer 7 and a gate electrode 5. It further comprises a p+ doped guard ring 11 which is in contact with the gate oxide layer 7 and which completely comprises said n+ doped region 3 except for a small region directly underneath the gate electrode 5. The p+ doped guard ring 11 and the n+ doped region 3 are separated laterally from each other by field oxide 9 and p-substrate 1. The field oxide 9 is not continuous: there is no continuous field oxide layer under the gate electrode 5, where the field oxide 9 is replaced by p-substrate. This can be seen in the cross-sectional side view of FIG. 2b, where the field oxide 9 is represented in dashed lines, which means that the field oxide 9 does not form part of the section, but that it is remote therefrom. In other words, there is no contact between the field oxide at the source side and the field oxide at the drain side. This way, no leak path can exist from source to drain through the field oxide because it is obstructed by an active area of the substrate which is controlled by the gate electrode 5. In the FIG. 2b, which shows a lateral view along line C–C', it can be seen that the p+ guard ring is separated laterally from the n+ doped region by p-substrate. Layers 11 and 3 are light gray with a dashed line around it, indicating that they are not part of the section. FIG. 2c shows a side view along line D–D' where the field oxide 9, extending partly under gate 5 is shown. Layers 3 and 11 are again light gray with a dashed line around it, as they do not extend underneath the electrode 5. FIG. 2d shows a cross-sectional side view along line K–K' in FIG. 2a. This cross-section goes through guard ring 11 and n+-doped region 3, which are represented in FIG. 2d in dark gray with a solid line around them. The gate electrode 5 is shown as a dashed line indicating that it is not part of the section but is remote therefrom.

Figure 3A:
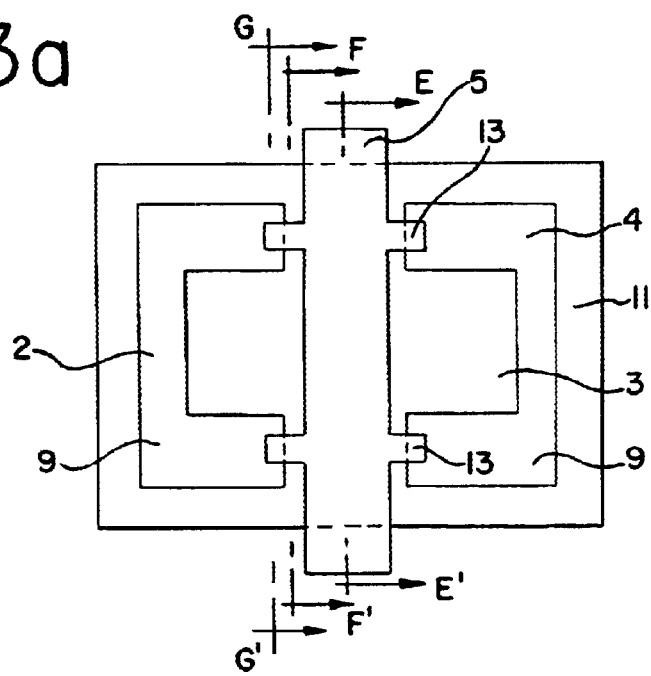
Figure 3B:
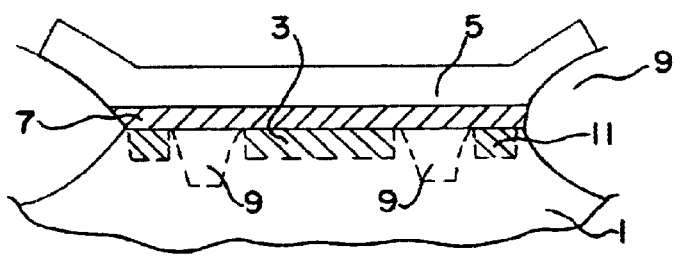
Figure 3C:
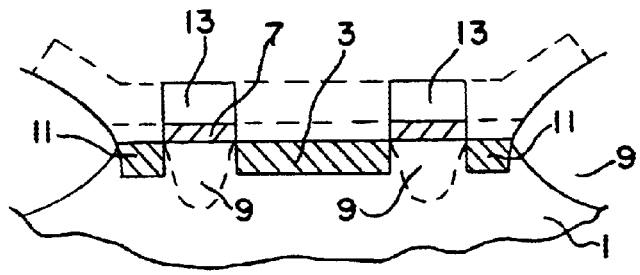
Figure 3D:
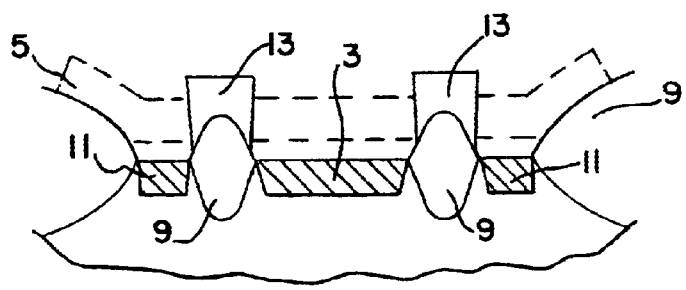

A second embodiment of the present invention is depicted in FIGS. 3a to d. This embodiment comprises an n+ doped region 3, a gate oxide layer 7 and a gate electrode 5. It further comprises a p+ doped guard ring 11 which is in contact with the gate oxide layer 7 and which surrounds said n+ doped region 3 laterally except for regions directly under the gate electrode 5. The p+ doped guard ring 11 and the n+ doped region 3 are separated from each other by field oxide 9 and p-substrate 1. Again, the field oxide at the source side and the field oxide at the drain side are separated from each other by a section of p-substrate 1. In this embodiment, the gate electrode 5 extends to contact the field oxide through lips 13. FIG. 3b shows a lateral view along the line E–E', showing that the p+ guard ring 11 is separated from the n+ doped region 3 by p-substrate 1. The guard ring 11, the n+ doped region and the field oxide 9 are not present at the level of the cross-section, but can be seen in a side view. Therefore, they are represented with a dotted line around them. FIG. 3c, a lateral view along line F–F' shows the gate electrode 5 extending through lips 13 towards the field oxide. The gate electrode 5 itself is not present at the cross-section. Gate oxide layer 7 is present under lips 13. Field oxide 9 underneath the lips 13 at the drain side of the device can be seen (dotted line). FIG. 3d draws a lateral view along line G–G' where it can be seen that the field oxide 9, which is in contact with lips 13 extending from gate 5, separates the p+ guard ring 11 from the n+ doped region 3.

Again, no leak path can exist from source to drain through the field oxide because it is obstructed by an active area of the substrate which is controlled by the gate electrode 5.

FIGS. 4*a* to *c* show a third embodiment of the present invention. The embodiment comprises an n+ doped region 3, a gate oxide layer 7 and a gate electrode 5. It further comprises a p+ doped guard ring 11 which is in contact with the gate oxide layer 7 and which surrounds said n+ doped region 3 laterally, except for regions directly underneath the gate electrode 5. The p+ doped guard ring 11 and the n+ doped region 3 are separated from each other by p-substrate 1 only. Field oxide 9 is present around the p+ guard ring and is in contact with gate electrode 5, but not with the source side 2 or the drain side 4 of the n+ doped region 3, so there can not be a current bridge formed by field oxide from source to drain. FIG. 4*b*, a side view along line H–H' in FIG. 4*a*, shows that the p+ guard ring 11 is separated from the n+ doped region 3 by p-substrate 1. The guard ring 11 and the n+ doped region are not present at the level of the cross-section, but can be seen in a side view. Therefore, they are represented with a dotted line around them. In FIG. 4*c*, a side view along line I–I' in FIG. 4*a*, both the guard ring 11 and the n+ doped region are present at the level of the section. The gate electrode 5 can be seen but is not present at the level of the cross-section.

In another embodiment of the present invention, a novel n-well/p-substrate photodiode structure is provided.

FIG. 5 shows a state of the art n-well/p-substrate photodiode. Said photodiode comprises an n+ doped region 3 embedded on an n-well 15. At the junction 17 of the field oxide 9 and the n+ doped region 3, irradiation can lead to increase of dark current. FIG. 5*b* is a lateral view along line J–J'.

Figure 6A:
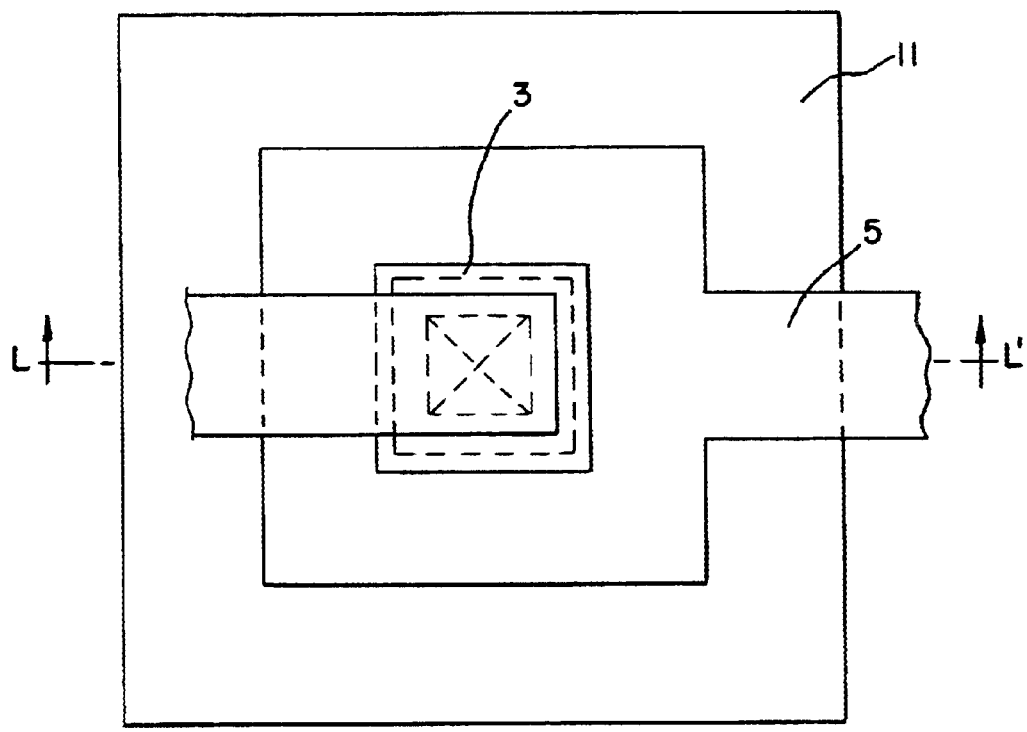
FIGS. 6a, b and 7a, b show two different embodiments of a photodiode comprising a p+ guard ring in accordance with the present invention.
Figure 6B:
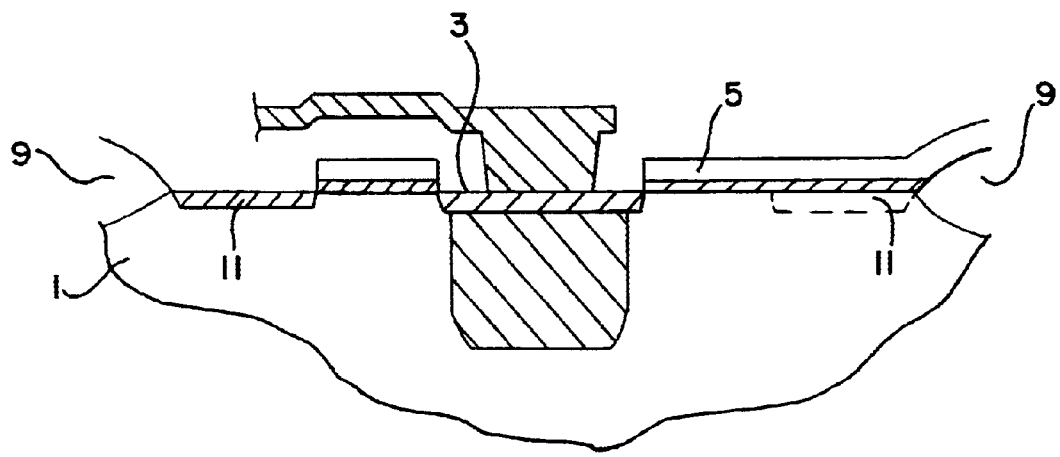
FIGS. 6b and 7b are corresponding cross-sectional side views along lines L–L' and M–M' in FIGS. 6a and 7a respectively.

In FIGS. 6*a* and *b*, a gated n-well/p-substrate photodiode with p+ guard ring according to a first embodiment of this aspect of the present invention is shown. FIG. 6*b* is a side view along line L–L' in FIG. 6*a*. The structure, embedded in p-substrate, comprises an n+ doped region 3, an n-well structure 15 situated under said n+ doped region and a p+ guard ring 11 completely surrounding said n+ doped region 3 except for a portion directly under gate electrode 5. It should be understood that other n+ doped regions of other semiconductor devices are located in the neighborhood of the diode and that parasitic currents can flow between the n+ region of the diode and these other n+ regions when the diode is subject to ionizing radiation. The p+ guard ring and the n+ doped region are not in contact, but are separated by p-substrate 1. Gate electrode 5, which can be used as a gate for a MOS structure, shields the photodiode structure from the field oxide 9, and field oxide 9 is thus not in contact with n+ doped region, and thus a leak current cannot be formed due to irradiation of the structure. Further, there is subtantially no change in capacitance of the diode when ionizing radiation is incident on the diode. The part of the guard ring 11 at the right hand side of FIG. 6*b* is not present at the level of the cross-section, but can be seen in de cross-sectional side view; Therefore it is drawn with a dotted line around it.

Figure 7A:
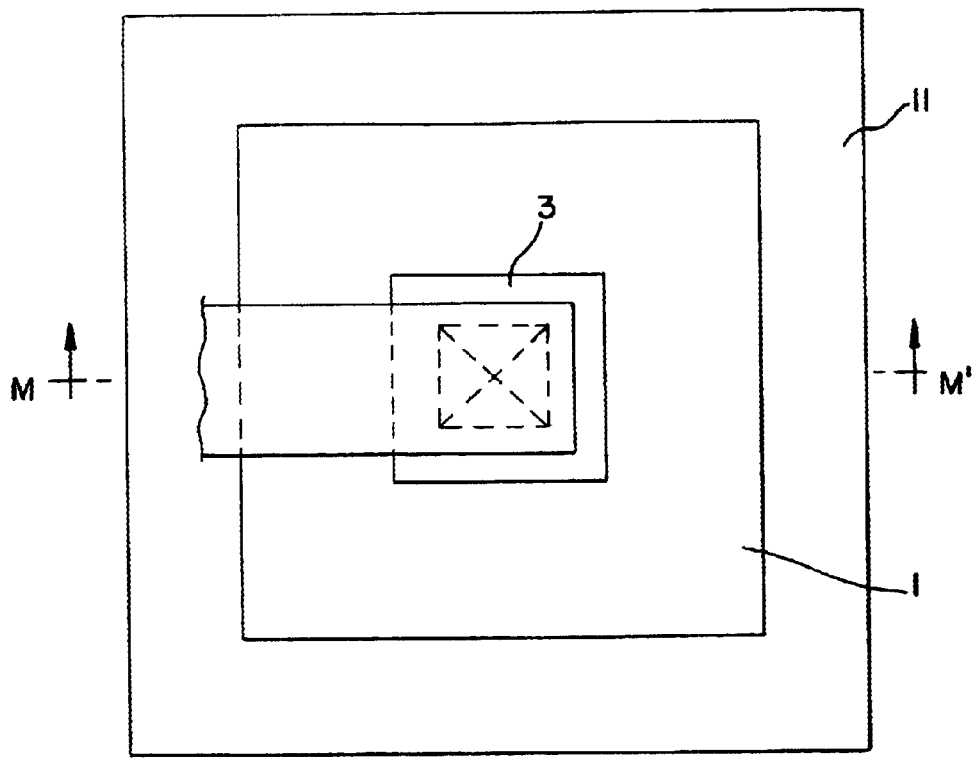
Figure 7B:
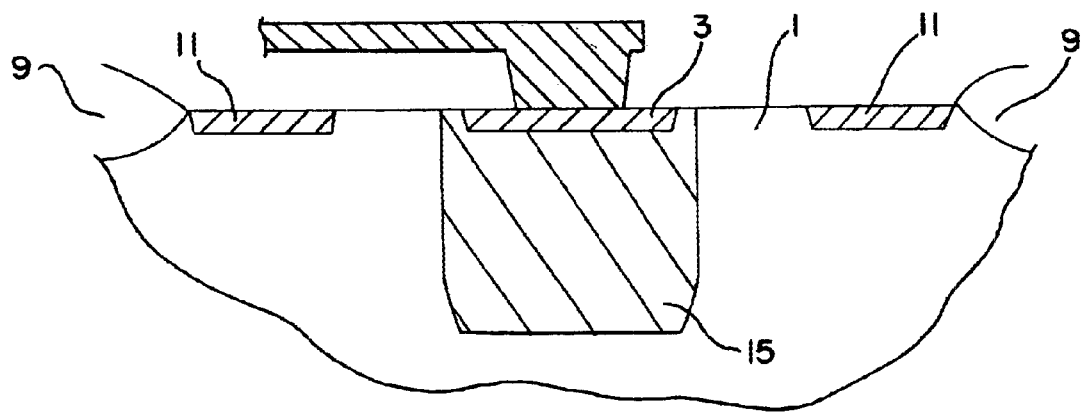

A second embodiment of this aspect of the present invention is shown in FIG. 7. Here, no gate is present, and now the field oxide 9 is shielded from the n-well structure by a p+ guard ring 11 which completely surrounds the n-well structure and is not in contact with said n-well structure, but is shielded from it by p-substrate 1.

Alternative embodiments to FIG. 6 are shown in FIGS. 9*a*, 9*b* and 10*a*, 10*b*.

Figure 9A:
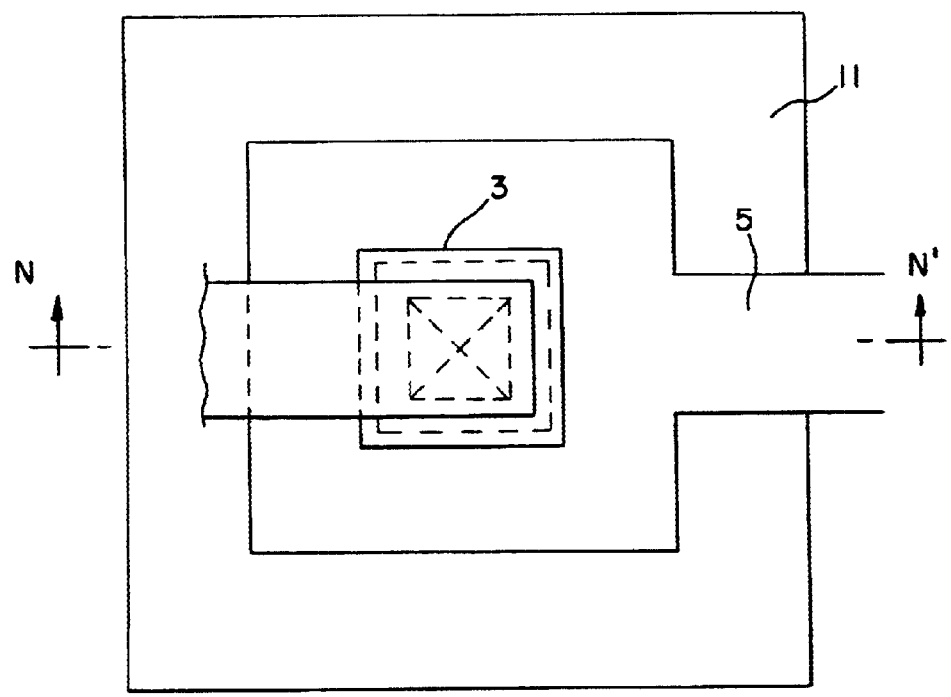
FIGS. 9a and 9b respectively show a top view and a cross-sectional side view along line N–N' in FIG. 9a of another embodiment of a photodiode according to the present invention.
Figure 9B:
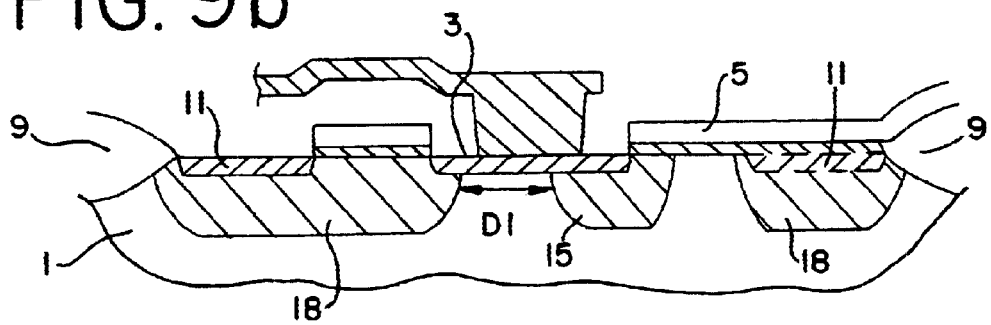

In FIGS. 9*a* and 9*b*, the photodiode is a structure as in FIGS. 6*a* and 6*b*. In this drawing it is shown that the photodiode 15 does not necessarily need to be aligned to the ring of polysilicon gate 5. It may even partly overlap. Additionally it shows the presence of a region 18, which is typically a lowly doped well of the same dopant type as the substrate, in the present case a p-well region. This p-well region 18 improves the shielding between neighbouring pixels and between the substrate and the surface. FIG. 9*b* schematically shows part of a pixel structure, e.g. an active pixel structure with the semiconductor substrate 1 having a p type doping. An additional lowly doped p-layer or p-well 18 is defined on or in the p type substrate 1. The p-well 18 can be defined by diffusion or by ion implantation or epitaxial growth or other techniques known in CMOS based processing. The n+ doped region 3 forms a junction with the p-well 18 and/or substrate 1. Region 3 is a collection junction for collecting the charge carriers being generated by radiation in the substrate 1. The radiation may be any type of radiation e.g. all forms of light including infra-red and ultraviolet as well as the optical spectrum, high energy electromagnetic rays such as X-rays and cosmic and nuclear particles. Said collection junction 3 has an enhanced collection for charge carriers that are generated in the radiation sensitive volume underneath other electronic components. Such functionality is made by means of an electrostatic barrier, that is formed at the interface of the substrate 1 and a region 18 with the same conductivity type as said substrate 1 underneath said other electronic components. The barrier prevents the charge carriers which are generated underneath said other electronic components from diffusing into junctions or structures of said other electronic components. According to the example, the collection junction 3 is a photodiode. An additional, optional n type region 15 can be defined and can overlap completely or partially said region 3. This n-well 15 extends from said region 3 to said substrate 1. This n-well 15 by preference is defined by a deep ion implantation step but may also be defined by other techniques known in CMOS based processing. The p-well 18 and the n-well 15 are such that there is a distance D1 between them, D1 including zero. As shown in FIG. 9*b*, the p-well 18 may partly overlap the polysilicon gate 6, and may touch the photodiode region 15 or can remain at a distance D1 from it.

By increasing the distance D1 between the p-well layer 18 and the n-well layer 15, or thus by forming a depletion layer or zone and a diffusion layer or zone at, or touching, the surface, the diffusion zone is now touching the surface, so that the effective volume for diffusion is larger, and the diode capacitance is lower. The peripheral parasitic capacitance of the junction n-well region and the p-well region is thus minimised by extending the size of the depletion layer around the n-well photodiode. The capacitance of a photodiode node is determined by the capacitance of the n-well plug 15 to the substrate 1 and to the p-well (perimeter) 18. By removing the p-well 18 in the direct environment of the n-well plug 4, the perimeter capacitance of the plug 4 becomes negligible. This technique therefore significantly reduces the total photodiode node capacitance and thus increases the conversion gain (charge to voltage conversion) proportionally. An increased sensitivity is thus obtained.

Figure 10A:
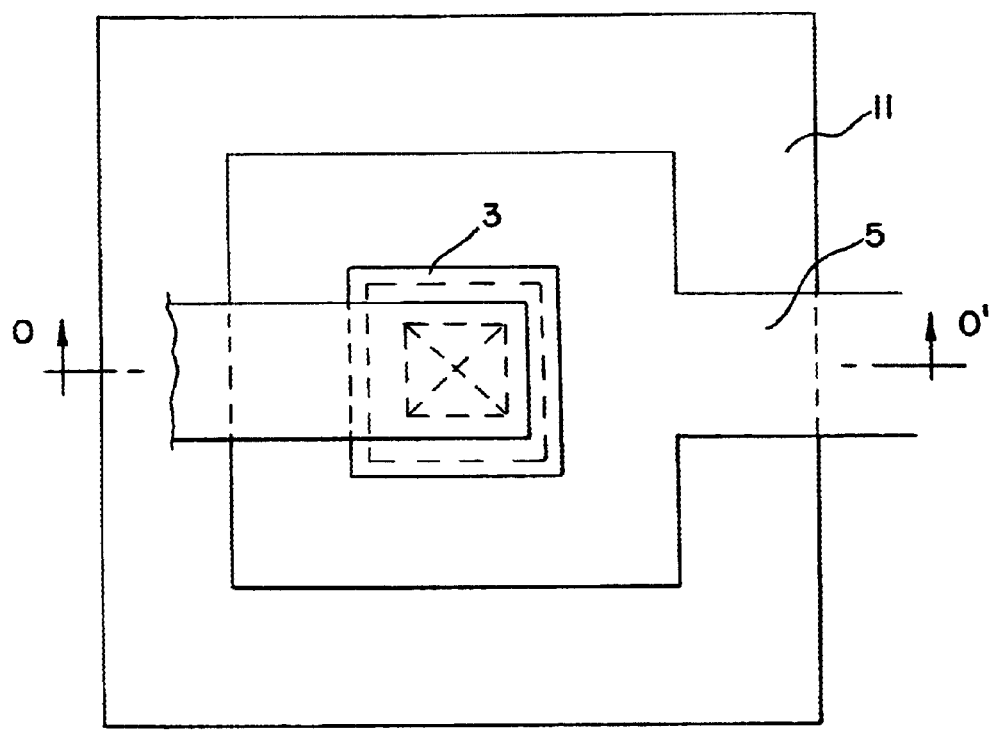
FIGS. 10a and 10b respectively show a top view and a cross-sectional side view along line O–O' in FIG. 10a of yet another embodiment of a photodiode according to the present invention.
Figure 10B:
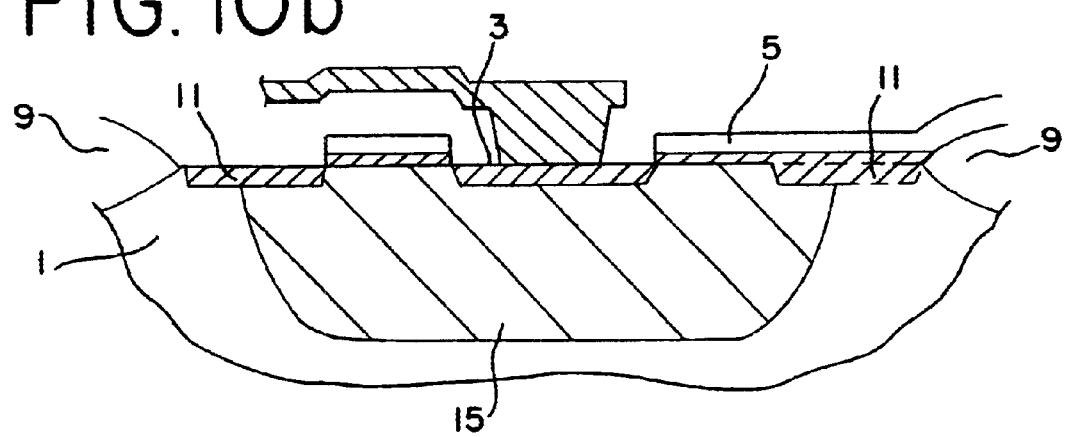

Alternatively, instead of providing both n-well and p-well, only an n-well may be provided, which extends underneath the guard ring 11, as shown in FIG. 10*b*. The photodiode 15 is extended over the gate electrodes 5 up to the guard ring 11. This embodiment results in a larger diode, which is thus more efficient in collecting minority charges, but which consequently also has a larger capacitance.

Figure 8:
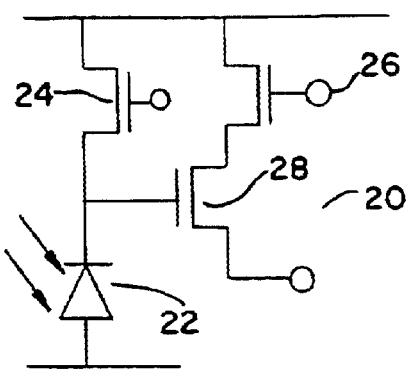
FIG. 8 is a schematic representation of a pixel with which the present invention may be used.

FIG. 8 is a schematic representation of a pixel 20 with which embodiments of the present invention may be used.

This pixel 20 will be described purely as an example of the uses of the present invention and is not limiting. A plurality of pixels 20 are normally fabricated as a large array of such pixels, e.g. in a camera as well as column and row read-out electronics. Each pixel comprises a photodiode 22, and one or more transistors 24, 26, 28 which may be used as charge storing devices, resistances, switching means, amplifying means, or similar as is well known to the skilled person. The photodiode 22 and transistors 24–28 may be subject to ionizing radiation while being relatively unprotected as the pixel must be accessible to other forms of radiation. The embodiments described above of transistor structures may find advantageous use as one of the transistors 24 to 28. The embodiments described above of diode devices may find advantageous use as the diode 22. In particular, the above devices do not require additional radiation protection so that the pixels may be fabricated by conventional VLSI fabricating processes.

The semiconductor devices described above are resistant to radiation, e.g. to 20 Mrad or more of incident ionizing radiation. Typical ionizing radiation may be cosmic rays, X-rays, γ-rays, UV, electrons, ions, protons and other nuclear particles.

What is claimed is:

1. A semiconductor transistor device structure for reducing radiation induced current flow caused by incident ionizing radiation, comprising:

a semiconductor substrate;

two or more regions of a first conductivity type in the substrate; and a doped guard ring of a second conductivity type surrounding the two or more regions of a first conductivity type for obstructing radiation induced parasitic current flow between the two or more regions of the first conductivity type, wherein the guard ring is a ring interrupted by an active area of the substrate controlled by a gate electrode.

2. The semiconductor device structure according to claim 1, wherein the active area is a region of undoped, semiconductor substrate or a doped region of the semiconductor substrate.

3. The semiconductor device structure of claim 1, wherein the two or more regions are n+ doped or n-inverted regions.

4. The semiconductor device structure of claim 1, wherein the guard ring is separated from the two or more regions of a first conductivity type by a field oxide layer.

5. The semiconductor device structure of claim 1 wherein the guard ring is separated from the two or more regions of a first conductivity type by an undoped region of the semiconductor substrate.

6. The semiconductor device structure of claim 1, wherein the device is a transistor and the two or more regions of the first conductivity type are main electrodes of the transistor.

7. A pixel sensitive to a radiation of a first type with reduced radiation induced current flow caused by incident ionizing radiation of a second type, comprising:

a semiconductor substrate;

two or more regions of a first conductivity type in the substrate; and a doped guard ring of a second conductivity type surrounding the two or more regions of a first conductivity type for obstructing radiation induced parasitic current flow between the two or more regions of the first conductivity type, wherein the guard ring is a ring interrupted by an active area of the substrate controlled by a gate electrode.

8. The pixel according to claim 7, wherein the active area is a region of undoped semiconductor substrate or a doped region of the semiconductor substrate.

9. The pixel according to claim 7, wherein the two or more regions of the first conductivity type are n+ doped or n-inverted regions.

10. The pixel according to claim 7, wherein the guard ring is separated from the two or more regions of the first conductivity type by a field oxide layer.

11. The pixel according to claim 7, wherein the guard ring is separated from the two or more regions of the first conductivity type by an undoped region of the semiconductor substrate.

12. The pixel according to claim 7, wherein the two or more regions of the first conductivity type are main electrodes of a transistor.

13. The pixel according to claim 7 wherein the at least one of the two or more regions of the first conductivity type is a main electrode of a diode.

14. The semiconductor transistor device structure according to claim 1 wherein a first region of a first conductivity type comprises a source part and a drain part separated by a junction, the gate electrode covers at least part of said junction, wherein a second region of the first conductivity type surrounds said first region but is not in direct contact with said first region.

15. A photodiode device comprising:

a semiconductor substrate;

a first region of a first conductivity type in the substrate;

a gate electrode surrounding said first region; and a doped guard ring of a second conductivity type surrounding said gate electrode, wherein the guard ring is a ring interrupted by an active area of the substrate controlled by the gate electrode.

16. The photodiode device according to claim 15, wherein the active area is a region of undoped, semiconductor substrate or a doped region of the semiconductor substrate.

17. The photodiode device of claim 16, wherein the first region is an n+ doped or n-inverted region.

18. The photodiode device of claim 16, wherein the guard ring is separated from the first region by an undoped region of the semiconductor substrate.

* * * * *